United States Patent [19]

Rees et al.

[11] Patent Number: 5,796,289

[45] Date of Patent: Aug. 18, 1998

[54] PASS TRANSISTOR CAPACITIVE COUPLING CONTROL CIRCUIT

[75] Inventors: David Brian Rees, Basingstoke, United Kingdom; Martin Jonathon Steadman, London, England

[73] Assignee: Cypress Semiconductor Corporation, San Jose, Calif.

[21] Appl. No.: 594,318

[22] Filed: Jan. 30, 1996

[51] Int. Cl.$^6$ ............................................. H03K 17/56
[52] U.S. Cl. ............................................. 327/425; 327/309
[58] Field of Search .......................... 326/113; 327/309, 327/310, 313, 389, 425, 581

[56] References Cited

U.S. PATENT DOCUMENTS

| | | | |
|---|---|---|---|
| 3,956,966 | 5/1976 | French | 327/581 |
| 4,618,743 | 10/1986 | Falater | 327/310 |
| 5,617,057 | 4/1997 | Rees et al. | 327/543 |

*Primary Examiner*—Timothy P. Callahan
*Assistant Examiner*—Jeffrey Zweizig
*Attorney, Agent, or Firm*—Bliss McGlynn, P.C.

[57] ABSTRACT

A bidirectional control circuit for preventing the improper functioning of a pass transistor MN1 in a CMOS circuit due to abnormally high voltages on its source and drain nodes IO1 and IO2. If the voltage on one of the nodes, IO1 or IO2, rises with a fast input edge rate, tending to cause the gate voltage V1 to go too high due to capacitive coupling (source-gate or drain-gate), node N1 is coupled through an appropriate capacitor, C1 or C2, to another node N3, which is normally held low by a transistor MN9. The voltage on N3 drives the gate of a transistor MN10, connected to node N1, to pull the gate voltage V1 of MN1 low, tending to discharge the capacitive coupling due to the overlap capacitance of MN1, which tends to turn MN1 OFF and also allows the voltage V1 to decay very quickly, so as to prevent some of the charge from IO1 getting through to IO2.

16 Claims, 1 Drawing Sheet

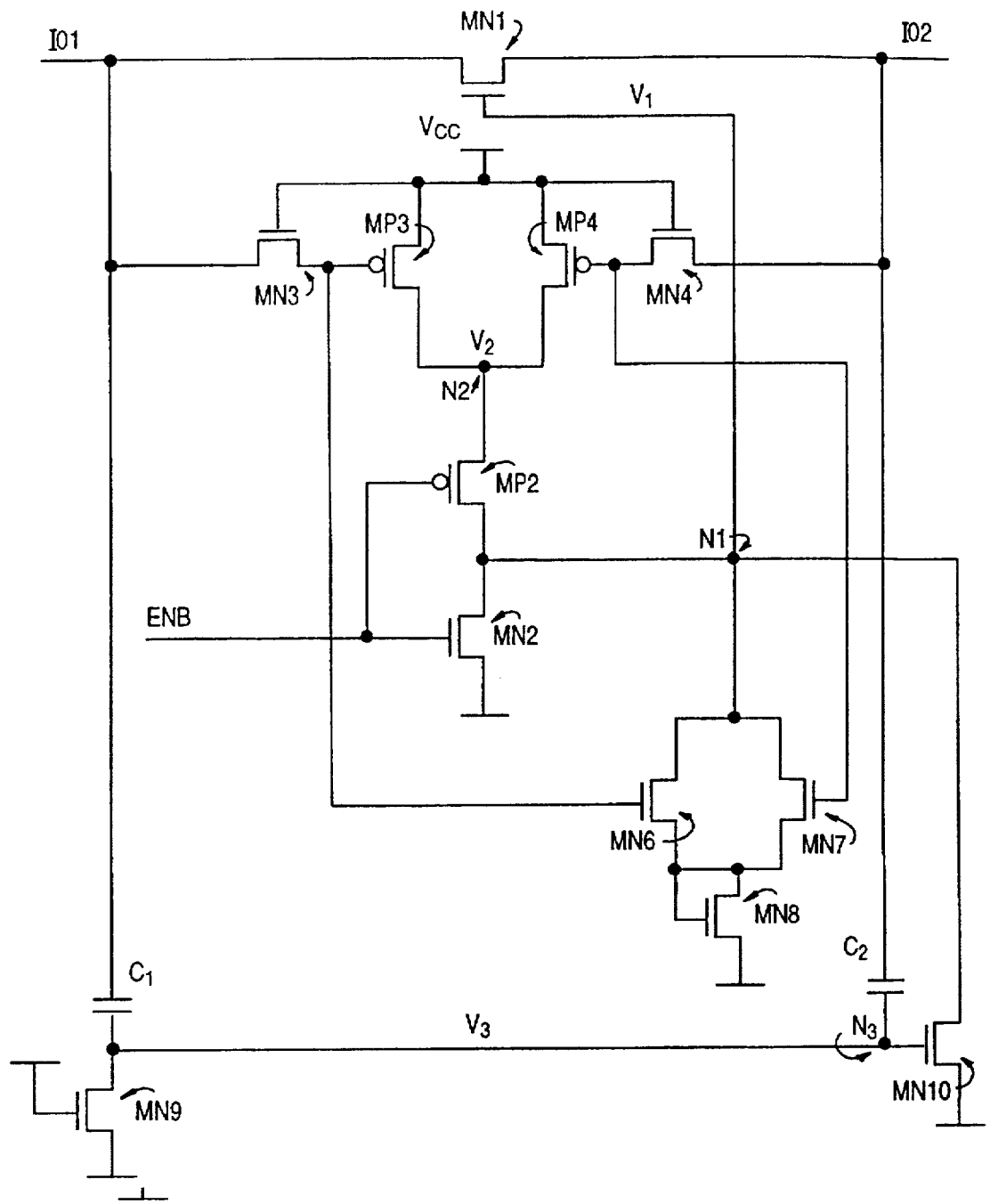

PASS TRANSISTOR CAPACITIVE COUPLING CONTROL CIRCUIT

BACKGROUND OF THE INVENTION

1. Field of the Invention

The present invention relates to integrated circuit CMOS technology and more particularly to a method and means for controlling the voltage applied to and across a pass transistor in a CMOS chip.

2. Prior Art

A pass transistor, e.g., an N-channel transistor MN1, in an integrated circuit CMOS chip has its source connected to one node IO1 and its drain connected to another node IO2 with its gate driven by a voltage V1 on a third node N1 (see FIG. 1). A $V_{gs}$ drop is required to keep transistor MN1 ON, so that if node IO1 is driven above VCC, the voltage on node IO2 should be limited to VCC - VTXNS5, where VTXNS5 is the transistor threshold voltage with the bulk connection tied to VCC. However, if VTXNS5 is not high enough, the voltage on IO2 will go higher than a design required limit drawing excess charge through MN1. Further, if IO1 is driven high very quickly, for instance, from 0 to 5 volts with a signal that has a fast rise time, then the capacitive coupling between IO1 and node N1, due to the overlap capacitance of MN1, will drive up the voltage V1 on node N1. This condition will allow more charge to flow through MN1 and hence the voltage on IO2 will also rise and may end up at a voltage considerably higher than anticipated. Under such circumstances, there is no mechanism, other than leakage, e.g., reverse-biased diode leakage through the drain of MN1, for the charge on IO2 to be removed even if the voltage on the gate of MN1 subsequently decays to a lower value.

Problem to be Solved It is therefore a problem in the CMOS chip art as to how to prevent the voltage on node IO2 from rising above a required level that would normally turn OFF the pass transistor MN1 and also prevent build up of unwanted charge that is difficult to remove.

Objects

It is accordingly an object of the present invention to provide a method and means for preventing an excessive voltage rise on the drain of the pass transistor in a CMOS chip due to a low transistor threshold voltage as a result of the semiconductor processing.

It is another object of the invention to provide such a method and means, for preventing the improper functioning of a pass transistor in a CMOS circuit due to abnormal voltages on its source and drain.

It is also an object of the invention to provide a circuit arrangement that will provide improved operation of a pass transistor in a CMOS chip.

It is a further object of the invention to provide a bi-directional circuit that ensures shutoff of a pass transistor in a CMOS circuit in the event of high and rapid applied voltage changes to its source or drain.

SUMMARY OF THE INVENTION

The present invention involves the provision of associated circuitry for preventing the improper functioning of a pass transistor in a CMOS circuit due to abnormally high voltages on its source and drain nodes IO1 and IO2. Such problematic functioning is avoided by node-voltage-sensing control circuitry that is completely bi-directional, all of the sensing circuits being duplicated for both nodes IO1 and IO2, and that feeds back a gate control voltage V1. Accordingly, a pair of transistors, N-channels MN3 and MN4, have their sources respectively coupled to nodes IO1 and IO2 and their gates driven by a supply voltage VCC. The drains of MN3 and MN4 respectively drive the gates of another pair of transistors, P-channels MP3 and MP4, having their sources coupled to VCC and their drains connected to a node N2 at voltage V2. Node N2 is connected to a conventional inverter in the form of a transistor pair, a P-channel transistor MP2 and an N-channel transistor MN2, that is used to control the pass transistor MN1 gate voltage V1, depending on the state of an ENB signal driving the gates of MP2 and MN2. To achieve this control, the inverter transistor MP2 has its source connected to N2 with its drain connected to N1. Thus, if the voltages on nodes IO1 and IO2 both go high, MP3 and MP4 will tend to turn OFF, dropping the voltage V2 on N2 below VCC and, via MP2, dropping gate voltage V1 below VCC and tending to turn MN1 OFF. The drains of MN3 and MN4 are also connected to respectively drive the gates of a further transistor pair, N-channels MN6 and MN7, having their sources connected to node N1 and their drains connected to an N-channel transistor MN8 to form a small current bleed network. If the voltages on nodes IO1 and IO2 are low, then the voltages on the gates of MP3 and MP4 are low, thus ensuring that these transistors are ON and that node N2 is pulled high to VCC.

The voltages on IO1 and IO2 are also respectively coupled via capacitances C1 and C2 to a node N3 with its voltage V3 normally held low by an N-channel transistor MN9 connected thereto. An N-channel transistor MN10 has its gate driven by V3 and its drain connected to node N1 so that if the voltage V3 rises for a short period of time, it will cause N-channel transistor MN10 to pull the voltage V1 of node N1 low tending to discharge node N1, which is capacitively coupled to nodes IO1 and IO2, due to the overlap capacitance of MN1.

The gate of MN1 and its operation is controlled by the voltage V1 on node N1. Node N1 is coupled to supply voltage VCC under the control of transistor pairs MN3, MN4 and MP3, MP4, and the inverter MP2, MN2, depending on the state of signal ENB. If the voltages on nodes IO1 and IO2 both go high, MP3 and MP4 will tend to be turned OFF dropping voltage V2 at node N2 below VCC and hence, via MP2, dropping gate voltage V1 at node N1 below VCC, tending to turn MN1 OFF. Leakage from node N1 in such event occurs through the small current bleed network formed by MN6, MN7, and MN8 to ensure that the node N1 voltage does reduce quickly since there is no other DC current path to ground. If the voltage on one of the nodes, IO1 or IO2, rises with a fast input edge rate, it is coupled through the appropriate capacitor, C1 or C2, to node N3, which is normally held low by MN9. This voltage rise on N3 causes MN10, connected to node N1, to pull the gate voltage V1 of MN1 low, tending to discharge the capacitive coupling due to the overlap capacitance of MN1 and hence tending to turn MN1 OFF, and also allowing the voltage V1 on node N1 to decay very quickly so as to prevent some of the charge from IO1 getting through to IO2.

BRIEF DESCRIPTION OF THE DRAWING

The present invention will be described in more detail below with reference to the accompanying drawings in which:

The FIG. is a schematic diagram of a CMOS circuit including an N-channel pass transistor and associated circuitry in accordance with the invention for controlling the voltages imposed on the pass transistor and preventing those voltages from creating undesirable conditions in the circuit.

DETAILED DESCRIPTION OF THE PREFERRED EMBODIMENT

The FIG. illustrates a CMOS chip circuit having a pass transistor, e.g., an N-channel transistor MN1, with its source connected to one node IO1 and its drain connected to another node IO2 and its gate driven by a voltage V1 on a third node N1. As seen in the FIG. a $V_{gs}$ drop is required to keep transistor MN1 ON, so that the voltage on node IO2 should be limited to VCC - VTXNS5 if node IO1 is driven above VCC, where VTXNS5 is the transistor threshold voltage with the bulk connection tied to VCC. However, if VTXNS5 is not high enough, the voltage on IO2 will go higher than required. Further, if IO1 is driven very quickly from 0 volts to, for instance, 5 volts, with a signal that has a fast rise time, then the capacitive coupling between IO1 and node N1, due to the gate-drain overlap capacitance of MN1, will drive up the voltage V1 on node N1. This rise in gate voltage will allow more charge to flow through MN1 and hence the voltage on IO2 will also rise and may end up at a voltage considerably higher than anticipated. Under such circumstances, there is no mechanism, other than leakage, for the charge on IO2 to be removed even if the voltage V1 on the gate of MN1 subsequently decays to a lower value.

The present invention involves the provision of associated control circuitry for preventing the improper functioning of such a pass transistor in a CMOS circuit due to abnormally high voltages occurring on the nodes IO1 and IO2. Such problematic functioning can be avoided by a control circuit that is completely bi-directional, so that all the sensing circuits are duplicated for both nodes IO1 and IO2. More particularly, a transistor pair is provided, consisting of a P-channel transistor MP2 and an N-channel transistor MN2, which form a conventional inverter to control the pass transistor MN1 gate voltage V1 on node N1, depending on the state of the ENB signal driving their gates. Another pair of transistors, N-channels MN3 and MN4, have their sources respectively coupled to nodes IO1 and IO2, sensing the voltages thereon, and their gates driven by supply voltage VCC. The drains of MN3 and MN4 respectively drive the gates of a further pair of transistors, P-channels MP3 and MP4, having their sources coupled to VCC and their drains connected to a node N2, providing a modified supply voltage V2, which is coupled to the source of MP2. When voltage ENB is low, V2 is passed by the inverter MP2 and MN2 to node N1 putting MN1 into the controlled ON state. When ENB is high, the inverter pulls N1 to ground and MP2 is turned OFF. The drains of MN3 and MN4 are also connected to respectively drive the gates of another transistor pair, N-channels MN6 and MN7, having their sources connected to node N1 and their drains connected to an N-channel-transistor MN8 to form a small current (a few 10s of microamps) bleed network for nodes N1 and N2.

Nodes IO1 and IO2 are also respectively coupled via capacitances C1 and C2 to a node N3 having its voltage V3 normally held low by an N-channel transistor MN9 connected thereto. Another N-channel transistor MN10 has its gate driven by V3 and its drain connected to node N1 so that if the voltage V3 rises for a short period of time, it will cause N-channel transistor MN10 to pull the voltage V1 of node N1 low tending to discharge the capacitive coupling due to the overlap capacitance of MN1.

In operation, to begin with if the voltage on node IO1 is low, then MN3 will pass a low onto the gate of MP3 so that voltage V2 on node N2, and hence node N1 and its voltage V1 through MP2, can be pulled all the way to VCC. Thus, the gate of MN1 goes to VCC and MN1 tends to stay ON. The same situation occurs when the voltage on IO2 is low, in this instance through transistors MN4 and MP4 and MP2. On the other hand, if the voltages on IO1 and IO2 both go high, then the voltages on the gates of MP3 and MP4 are raised to within a $V_{Tn}$ drop of IO1 and IO2 by MN3 and MN4. This will tend to turn OFF the transistors MP3 and MP4 so that the voltage on V2 cannot get to VCC and similarly the gate of MN1 drops below VCC so that MN1 will tend to turn OFF. This prevents extra charge from IO1 flowing to IO2. To ensure that V2 can actually drop, the drain of MP2 is connected through node N1 to the N-channel transistors MN6, MN7, and MN8 which form a small current bleed network of a few 10s of microamps.

Accordingly, the voltage on the drain, from IO2, of pass transistor MN1 is controlled from going too high by sensing its voltage and using a suitable feedback circuit to control the gate of the pass transistor.

If the voltage on IO1 or IO2 rises with a fast input edge rate, then this rise is coupled via capacitances C1 and C2 to the node N3, the voltage V3 of which is normally held low by N-channel transistor MN9. If the voltage V3, in response to the coupled fast rise, itself rises for a short period of time, it will cause N-channel transistor MN10 to pull the voltage V1 of node N1 low tending to discharge the capacitive coupling due to the overlap capacitance of MN1. It will also allow the voltage V1 on node N1 to decay very quickly so as to prevent some of the charge from IO1 getting through to IO2. Thus, the voltage on the gate of pass transistor MN1 is controlled from going too high due to capacitive coupling (source-gate or drain-gate) by capacitively coupling the source/drain voltages, on IO1 and IO2, to the gate of another transistor MN10 which can discharge the gate of the pass transistor MN1.

In summary therefore, it will be seen that the proper functioning of pass transistor MN1 when subjected to abnormally high voltages is controlled by its gate voltage V1 on node N1. Node N1 is normally coupled to supply voltage VCC, under the control of transistor pairs MN3, MN4 and MP3, MP4, and the inverter MP2, MN2, when the voltage on nodes IO1 and IO2 is low. This is also controlled by the state of signal ENB. If the voltages on nodes IO1 and IO2 then both go high, MP3 and MP4 will tend to turn OFF dropping gate voltage V1 below VCC and tending to turn MN1 OFF. Leakage from node N1 in such event occurs through the small current bleed network formed by MN6, MN7, and MN8. If the voltage on one of the nodes, IO1 or IO2, rises with a fast input edge rate, it is coupled through the appropriate capacitor, C1 or C2, to node N3, which is normally held low by MN9. This voltage rise on N3 causes MN10, connected to node N1, to pull the gate voltage V1 of MN1 low, tending to discharge the capacitive coupling due to the overlap capacitance of MN1 (which would otherwise turn MN1 even further ON, and also allowing the voltage V1 on node N1 to decay very quickly) so as to prevent some of the charge from IO1 getting through to IO2.

Thus, a circuit arrangement is presented for controlling the voltages on a pass transistor in a CMOS circuit to prevent improper functioning thereof. This arrangement should have a minimal impact on die size and on the pass transistor operating normally.

While the present invention has been described in terms of specific embodiments and combinations, it will be appreciated that the invention is not limited to the particular examples presented herein, that those of skill in the art may readily implement alternative forms in the light of the examples, and that the scope of the protection is defined in the attached claims.

What is claimed is:

1. A circuit comprising:
    a pass transistor having a source connected to a first node,
        a drain connected to a second node and a gate connected to a third node;

a first capacitor coupled to said first node and a second capacitor coupled to said second node, said first and second capacitors coupled in common to a fourth node; and a second transistor having a gate connected to said fourth node and a source connected to said third node, wherein said second transistor is configured to turn off said pass transistor in response to a voltage higher than a design limit at either said first node or said second node.

2. The circuit according to claim 1, further comprising:

a device connected to said fourth node, wherein said device holds said fourth node at a predetermined voltage when said voltage at said first and second nodes is not higher than said design limit.

3. A circuit according to claim 1, wherein said design limit is for an input edge rate.

4. The circuit according to claim 1 wherein said design limit is for a voltage.

5. The circuit according claim 4, wherein said voltage comprises a supply voltage minus a threshold voltage.

6. The circuit according to claim 4, wherein said supply voltage is 5.0 volts.

7. A circuit according to claim 2 further comprising:

an inverter circuit connected to said third node comprising a third transistor of the same channel type as said pass transistor and a fourth transistor of the other channel type with their gates coupled to an enable signal and their drains connected to said third node;

a fifth and sixth transistor of said fourth transistor channel type having their drains connected to the source of said third transistor and their sources connected to a supply voltage; and a seventh and eighth transistor of said pass transistor channel type, having their drains respectively connected to the gates of said fifth and sixth transistors, their gates connected to said supply voltage, and their sources respectively connected to said first and second nodes.

8. The circuit according to claim 7, further comprising:

a ninth and tenth transistor of said pass transistor channel type having their sources connected to said third node, their gates respectively connected to the gates of said fifth and sixth transistors, and their drains coupled to ground through an eleventh transistor of said pass transistor channel type.

9. A circuit as in claim 4 wherein said transistors of said fourth transistor channel type are P-channel transistors.

10. A method for inhibiting or preventing damage to a first transistor comprising the steps of:

capacitively coupling a first voltage at a source and/or drain of said first transistor to a node controlling a gate of a second transistor, said second transistor controlling a second voltage at a gate of said first transistor; and turning said first transistor off in response to said first voltage exceeding a design limit.

11. A method according to claim 10 further comprising the step of:

coupling said node to a third predetermined voltage.

12. The method according to claim 11 further comprising the step of:

turning said second transistor on when said first voltage at said source or drain of said first transistor exceeds said design limit.

13. A method according to claim 10, wherein said design limit is for an input edge rate.

14. The method according to claim 10, wherein said design limit is for a voltage.

15. The method according claim 14, wherein said voltage comprises a supply voltage minus a threshold voltage.

16. The method according to claim 14, wherein said supply voltage is 5.0 volts.

\* \* \* \* \*